US010444086B2

(12) United States Patent
Sipila et al.

(10) Patent No.: US 10,444,086 B2
(45) Date of Patent: *Oct. 15, 2019

(54) SYSTEM AND METHOD OF MAGNETIC SHIELDING FOR SENSORS (71) Applicant: General Electric Company, Schenectady, NY (US)

(72) Inventors: Pekka Tapani Sipila, Aiglsbach (DE); Lam Arthur Campbell, Houston, TX (US); Dan Tho Lu, Minden, NV (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/151,684

(22) Filed: Oct. 4, 2018

(65) Prior Publication Data
US 2019/0041279 A1 Feb. 7, 2019

Related U.S. Application Data (63) Continuation of application No. 15/250,557, filed on Aug. 29, 2016, now Pat. No. 10,094,720, which is a
(Continued)

(51) Int. Cl.
*G01L 1/12* (2006.01)
*G01R 33/09* (2006.01)
(Continued)

(52) U.S. Cl.
CPC .............. *G01L 1/125* (2013.01); *G01L 3/102* (2013.01); *G01L 3/105* (2013.01); *G01R 33/091* (2013.01);
(Continued)

(58) Field of Classification Search
CPC . G01L 1/12; G01L 1/125; G01L 1/127; G01L 3/10; G01L 3/101–105;
(Continued)

(56) References Cited

U.S. PATENT DOCUMENTS 2,468,154 A 4/1949 Ashworth et al.
3,798,537 A 3/1974 Dahm
(Continued)

FOREIGN PATENT DOCUMENTS

CN 102519633 6/2012
EP 2615439 7/2013

OTHER PUBLICATIONS

Fleming, Willilam J., "Magnetostrictive Torque Sensors—Derivation of Transducer Model", International Congress and Exposition, Detroit, Michigan, Feb. 27-Mar. 3, 1989, SAE/Technical Paper Series.
(Continued)

*Primary Examiner* — Jonathan M Dunlap
(74) *Attorney, Agent, or Firm* — Mintz Levin Cohn Ferris Glovsky and Popeo, P.C.

(57) ABSTRACT

A system includes a magnetostrictive sensor. The magnetostrictive sensor includes a driving coil configured to receive a first driving current and to emit a first magnetic flux portion through a target and a second magnetic flux portion. The magnetostrictive sensor also includes a first sensing coil configured to receive the first magnetic flux portion and to transmit a signal based at least in part on the received first magnetic flux portion. The received first magnetic flux portion is based at least in part on a force on the target. The magnetostrictive sensor includes a magnetic shield disposed between the driving coil and the first sensing coil. The magnetic shield is configured to reduce the second magnetic flux portion received by the first sensing coil. The magnetic shield includes a composite with a conductive material and an insulating material, a metamaterial, or a mesh structure, or any combination thereof.

16 Claims, 8 Drawing Sheets

US 10,444,086 B2

Page 2

Related U.S. Application Data continuation-in-part of application No. 14/249,991, filed on Apr. 10, 2014, now Pat. No. 9,429,488.

(51) Int. Cl.
*G01L 3/10* (2006.01)
*G01R 15/20* (2006.01)
*G01L 9/16* (2006.01)

(52) U.S. Cl.
CPC .............. *G01L 1/12* (2013.01); *G01L 1/127* (2013.01); *G01L 3/10* (2013.01); *G01L 9/16* (2013.01); *G01R 15/205* (2013.01)

(58) Field of Classification Search
CPC ......... G01L 3/1435; G01L 9/007; G01L 9/10; G01L 9/16; G01N 2291/02863; G01N 2291/102; G01R 15/85; G01R 15/205; G01R 33/04; G01R 33/12; G01R 33/18
See application file for complete search history.

(56) References Cited

U.S. PATENT DOCUMENTS

| | | |
|---|---|---|
| 3,861,206 A | 1/1975 | Kawafune et al. |
| 4,030,346 A | 6/1977 | Dahle et al. |
| 4,378,322 A | 3/1983 | Atterbury et al. |
| 4,566,338 A | 1/1986 | Fleming et al. |
| 4,627,298 A | 12/1986 | Sahashi et al. |
| 4,647,714 A | 3/1987 | Goto |
| 4,774,148 A | 9/1988 | Goto |
| 4,841,235 A | 6/1989 | Hastings et al. |
| 4,920,806 A | 5/1990 | Obama et al. |
| 4,931,730 A | 6/1990 | Olsen et al. |
| 5,010,299 A | 4/1991 | Nishizawa et al. |
| 5,062,307 A | 11/1991 | Ikeda et al. |
| 5,278,497 A | 1/1994 | Ariyoshi |
| 5,301,559 A | 4/1994 | Tsuji et al. |
| 5,394,083 A | 2/1995 | Jiles |
| 5,542,304 A | 8/1996 | Sasada et al. |
| 5,565,773 A | 10/1996 | Inaguma et al. |
| 5,574,231 A | 11/1996 | Blomkvist et al. |
| 5,608,691 A | 3/1997 | MacLauchlan et al. |
| 5,831,180 A | 11/1998 | Tanaka et al. |
| 5,902,934 A | 5/1999 | Sprague et al. |
| 6,411,078 B1 | 6/2002 | Nakagawa et al. |
| 6,492,808 B1 | 12/2002 | Sukhorukov et al. |
| 6,494,102 B2 | 12/2002 | Hanisko |
| 7,164,263 B2 | 1/2007 | Yakymyshyn et al. |
| 7,560,920 B1 | 7/2009 | Ouyang et al. |
| 7,832,289 B2 | 11/2010 | Garshelis et al. |
| 8,087,304 B2 | 1/2012 | Lee |
| 8,438,937 B2 | 5/2013 | Garshelis et al. |
| 8,578,794 B2 | 11/2013 | Lee |
| 8,596,129 B2 | 12/2013 | Niese |
| 8,729,889 B2 | 5/2014 | Ghislanzoni |
| 9,134,188 B2 | 9/2015 | May |
| 9,146,163 B2 | 9/2015 | Sipila et al. |
| 9,212,958 B2 | 12/2015 | Campbell et al. |
| 2002/0092358 A1 | 7/2002 | Hanisko |
| 2002/0163330 A1 | 11/2002 | Sekiya |
| 2008/0070003 A1 | 3/2008 | Nakatani et al. |
| 2009/0007697 A1 | 1/2009 | May |
| 2009/0066332 A1 | 3/2009 | Yatsuo et al. |
| 2009/0145239 A1 | 6/2009 | Girshovich et al. |
| 2010/0019762 A1 | 1/2010 | Furusawa et al. |
| 2010/0148766 A1 | 6/2010 | Weischedel |
| 2011/0012593 A1 | 1/2011 | Shvartsman et al. |
| 2011/0308330 A1 | 12/2011 | May |
| 2012/0126833 A1 | 5/2012 | Dooley |
| 2013/0083443 A1 | 4/2013 | Edwards |
| 2014/0184210 A1 | 7/2014 | Campbell et al. |
| 2014/0232389 A1 | 8/2014 | Maier et al. |
| 2014/0298916 A1 | 10/2014 | Duan et al. |
| 2014/0327434 A1 | 11/2014 | Sasada |
| 2014/0366637 A1 | 12/2014 | Brummel et al. |
| 2015/0028859 A1 | 1/2015 | May |
| 2015/0130454 A1 | 5/2015 | Itoi et al. |
| 2015/0143923 A1 | 5/2015 | Saito et al. |
| 2016/0187162 A1 | 6/2016 | May |

OTHER PUBLICATIONS

International Search Report from PCT application No. PCT/US2015/020682, dated Jul. 23, 2015.

Yin, Yichao, "Enhanced High-Frequency Absorption of Anisotropic FE304/Graphene Nanocomposites", Scientific Reports, vol. 6, Article No. 25075, May 4, 2016.

SYSTEM AND METHOD OF MAGNETIC SHIELDING FOR SENSORS

CROSS-REFERENCE TO RELATED APPLICATIONS

This application is a continuation of U.S. application Ser. No. 15/250,557, entitled "SYSTEM AND METHOD OF MAGNETIC SHIELDING FOR SENSORS," filed on Aug. 29, 2016, which is continuation-in-part of U.S. application Ser. No. 14/249,991 (now U.S. Pat. No. 9,429,488), entitled "SYSTEM AND METHOD OF MAGNETIC SHIELDING FOR SENSORS," filed Apr. 10, 2014, which are hereby incorporated by reference in their entireties.

BACKGROUND

The subject matter disclosed herein relates generally to sensors, and more particularly to magnetic shields for magnetostrictive sensors.

Sensors are used in a variety of industries to sense vibration, torque, speed, force, position, and other parameters. In certain applications, the performance of the sensor may decrease due to electrical and/or magnetic interference. Furthermore, some sensors may depend on magnetic principles for their operation, and thus a leakage magnetic flux may result in performance degradation.

BRIEF DESCRIPTION

Certain embodiments commensurate in scope with the present disclosure are summarized below. These embodiments are not intended to limit the scope of the claims, but rather these embodiments are intended only to provide a brief summary of certain embodiments. Indeed, embodiments of the present disclosure may encompass a variety of forms that may be similar to or different from the embodiments set forth below.

In a first embodiment, a system includes a magnetostrictive sensor. The magnetostrictive sensor includes a driving coil configured to receive a first driving current and to emit a first magnetic flux portion through a target and a second magnetic flux portion. The magnetostrictive sensor also includes a first sensing coil configured to receive the first magnetic flux portion and the second magnetic flux portion, and to transmit a signal based at least in part on the received first magnetic flux portion. The received first magnetic flux portion is based at least in part on a force on the target. The magnetostrictive sensor further includes a magnetic shield disposed between the driving coil and the first sensing coil. The magnetic shield is configured to reduce the second magnetic flux portion received by the first sensing coil. The magnetic shield includes a composite, a metamaterial, or a mesh structure, or any combination thereof. The composite includes at last one conductive material and at least one insulating material.

In a second embodiment, a system includes a magnetostrictive sensor. The magnetostrictive sensor includes a driving coil configured to receive a first driving current and to emit a first magnetic flux portion through a target and a second magnetic flux portion. The magnetostrictive sensor also includes a first sensing coil configured to receive the first magnetic flux portion and the second magnetic flux portion, and to transmit a signal based at least in part on the received first magnetic flux portion. The received first magnetic flux portion is based at least in part on a force on the target. The magnetostrictive sensor further includes an active magnetic shield disposed between the driving coil and the first sensing coil. The active magnetic shield is configured to receive a second driving current and to emit a third magnetic flux portion with a magnitude substantially equal to the second magnetic flux portion and with a direction substantially opposite to the second magnetic flux portion. The active magnetic shield is configured to reduce the second magnetic flux portion received by the first sensing coil.

In a third embodiment, a method includes supplying a first current to a driving coil of a magnetostrictive sensor. The method also includes emitting a first magnetic flux portion from the driving coil through a target. Furthermore, the method includes emitting a second magnetic flux portion from the driving coil. Moreover, the method includes sensing the first magnetic flux portion with a sensing coil of the magnetostrictive sensor. Still, the method includes reducing the second magnetic flux portion received by the sensing coil based at least in part on a magnetic shield of the magnetostrictive sensor disposed between the driving coil and the sensing coil. The method includes supplying a second current to a compensation coil of the magnetic shield, and emitting a third magnetic flux portion from the compensation coil in a direction substantially opposite to the second magnetic flux portion.

BRIEF DESCRIPTION OF THE DRAWINGS

These and other features, aspects, and advantages of the present disclosure will be better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

The present disclosure provides systems and methods for a sensor. For example, a sensor that measures a magnetic field through an object may be used to determine a force on the object. Sensed magnetic fields that do not extend through the object being measured may affect a quality of the determined force on the object. These fields that do not extend through the object being measured may be called leakage magnetic fields. As described in more detail below, embodiments of the disclosed subject matter relate to reducing the leakage magnetic fields that may be sensed by the sensor. Embodiments of the disclosed subject matter may use one or more magnetic shields at locations within the sensor to reduce the leakage magnetic fields and to improve the quality of the determined force on the object.

Ferromagnetic materials have a magnetostrictive property that causes the materials to change shape in the presence of an applied magnetic field. Conversely, when a force is applied to a ferromagnetic material to cause the shape to change, the magnetic properties (e.g., magnetic permeability) of the material also change. Therefore, ferromagnetic materials can convert magnetic energy into potential energy, or potential energy into magnetic energy. Accordingly, ferromagnetic materials may be used for sensors such as force sensors, position sensors, and torque sensors. A magnetostrictive sensor may generate a magnetic flux to pass through a ferromagnetic material.

A magnetostrictive sensor may include a driving coil to generate magnetic flux and a sensing pole to sense the magnetic flux passing through a ferromagnetic material (e.g., a target material). Because the changes in the measured magnetic flux depend partly on the changes in magnetic permeability of the ferromagnetic material, which in turn are related to the amount of force applied to the ferromagnetic material, measurement of the magnetic flux may be used to sense and/or calculate the value of the applied force. Unfortunately, a leakage magnetic flux from the driving coil to the sensing coil may occur in the magnetostrictive sensor. The leakage magnetic flux does not pass through the ferromagnetic material and, therefore, provides little information on the magnetic permeability of the ferromagnetic material. In addition, because the leakage magnetic flux also passes through the sensing coil, the leakage magnetic flux may be a noise relative to the measured magnetic flux that is from the driving coil to the sensing coil passing through the ferromagnetic material. Such noise may reduce the dynamic range of the magnetostrictive sensor.

The present disclosure provides a magnetostrictive sensor with a magnetic shield. As discussed in greater detail below, the magnetic shield may be disposed in the space between a driving pole and a sensing pole of the magnetostrictive sensor. The magnetic shield may also be disposed about the driving pole. The magnetic shield may reduce or eliminate the leakage flux between the driving pole and the sensing pole. Advantageously, the resulting magnetostrictive sensor may have an increased dynamic sensing range. In addition, the magnetic shield may improve the signal to noise ratio of the magnetostrictive sensor. Furthermore, by including the magnetic shield, the magnetostrictive sensor may use a simpler conditioning circuitry.

Figure 1:
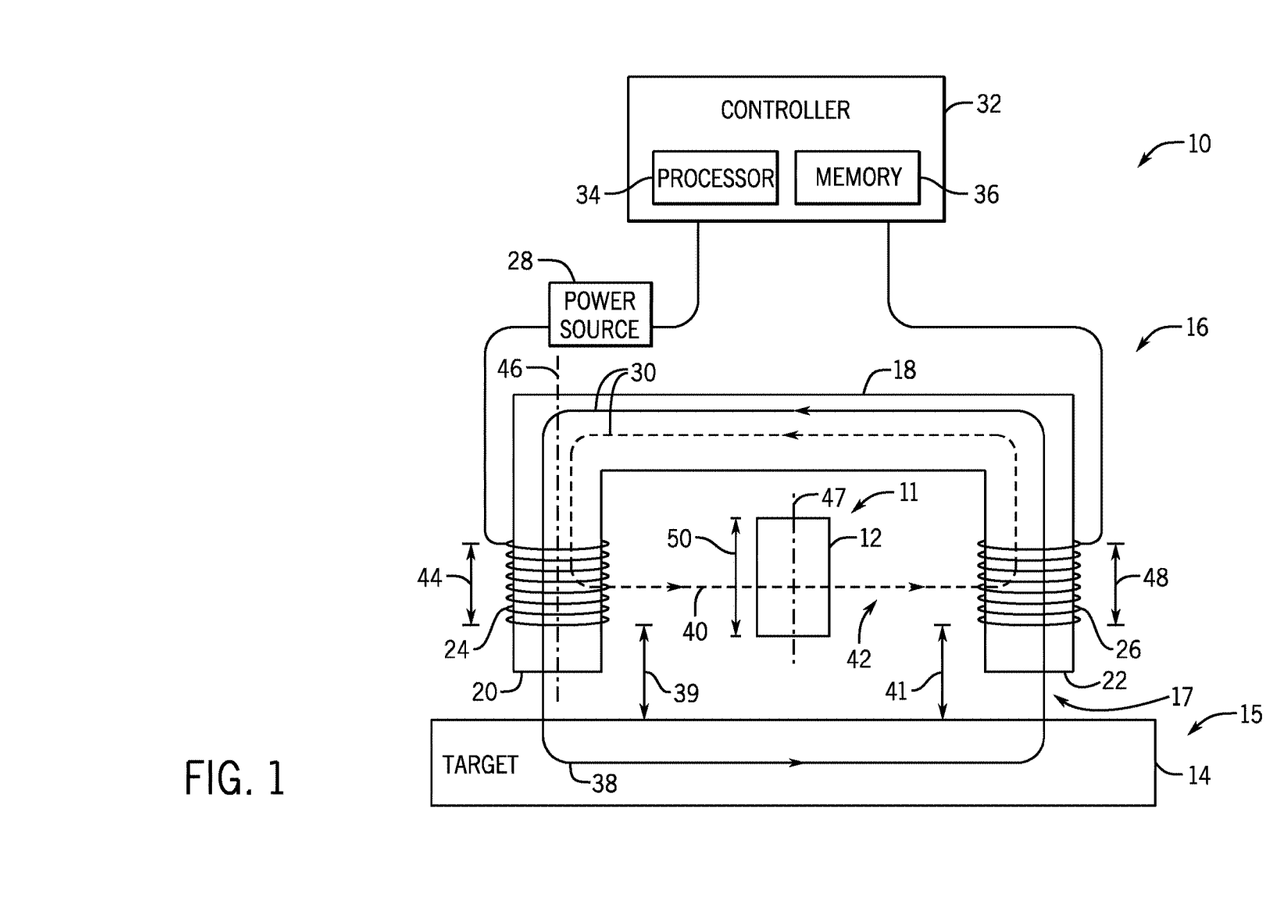
FIG. 1 is a side view of an embodiment of a magnetostrictive sensing system with a magnetic shield in accordance with the present disclosure.

FIG. 1 is a side view of an embodiment of a magnetostrictive sensing system 10 with a magnetic shield 11 (e.g., a magnetic shield 12) in accordance with the present disclosure. The magnetostrictive sensing system 10 may be used for sensing a force applied to a target material 14 of a machine or equipment 15, such as a turbomachine (e.g., a turbine engine, a compressor, a pump, or a combination thereof), a generator, a combustion engine, or a combination thereof. The target material 14 may be a ferromagnetic material including, but not limited to, iron, steel, nickel, cobalt, alloys of one or more of these materials, or any combination thereof. The magnetostrictive sensing system 10 includes a sensor head 16 positioned proximate to the target material 14, thereby forming a gap 17 between the sensor head 16 and the target material 14. The sensor head 16 may be coupled to a frame or fixture to maintain the sensor head 16 in the proper orientation and/or position.

The sensor head 16 has a core 18 that may be formed from a ferromagnetic material. The core 18 has at least two ends, such as a driving pole 20 and a sensing pole 22. A driving coil 24 and a sensing coil 26 are disposed about (e.g., wrapped around) the driving pole 20 and the sensing pole 22, respectively. A power source 28 (e.g., electrical outlet, electrical generator, battery, etc.) provides an AC current (e.g., first driving current) to the driving coil 24. The first driving current passes through the driving coil 24 to induce a magnetic flux 30 that emanates from the driving coil 24. A controller 32 electronically coupled to the power source 28 is configured to control characteristics of the first driving current delivered to the driving coil 24 by the power source 28. For example, the controller 32 may control the frequency, amplitude, or the like, of the first driving current. The controller 32 may be coupled to the power source 28 by wired or wireless connections. Wireless communication devices such as radio transmitters may be integrated with the controller 32 to transmit the signals to a receiver integrated with the power source 28.

The controller 32 may include a distributed control system (DCS) or any computer-based workstation that is fully or partially automated. For example, the controller 32 may be any device employing a general purpose or an application-specific processor 34, both of which may generally include memory circuitry 36 for storing instructions related to frequencies, amplitudes of currents, for example. The processor 34 may include one or more processing devices, and the memory circuitry 36 may include one or more tangible, non-transitory, machine-readable media collectively storing instructions executable by the processor 34 to perform the methods and control actions described herein.

Such machine-readable media can be any available media other than signals that can be accessed by the processor or by any general purpose or special purpose computer or other machine with a processor. By way of example, such machine-readable media can include RAM, ROM, EPROM, EEPROM, CD-ROM, or other optical disk storage, magnetic disk storage or other magnetic storage devices, or any other medium which can be used to carry or store desired program code in the form of machine-executable instructions or data structures and which can be accessed by the processor or by any general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions includes, for example, instructions and data which cause the processor or any general purpose computer, special purpose computer, or special purpose processing machine to perform a certain function or group of functions.

As illustrated, a first magnetic flux portion 38 permeates the target material 14, passes through the sensing coil 26, and returns to the driving coil 24 via the core 18. The sensing coil 26 may be used to measure the first magnetic flux portion 38. A force (e.g., compressive, tensile, torsional, etc.) applied to the target material 14 may change the permeability of the target material 14, thereby causing the first magnetic flux portion 38 to change. The sensing coil 26 is configured to transmit a signal indicative of the changes in the first magnetic flux portion 38 to the controller 32. The processor 34 of the controller 32 may process the signal received from the sensing coil 26 to calculate the force applied to the target material 14. For example, the processor 34 may execute pre-stored and/or user-defined algorithms in the memory 36 to calculate the magnitude and/or direction of the force applied to the target material 14 based on the characteristics of the target material 14, the sensor head 16, and the first driving current. The signal from the sensing coil 26 may be communicated by wired or wireless connections to the controller 32. In some embodiments, wireless communication devices, such as radio transmitters, may be integrated with the sensor head 16 (e.g., proximate to the sensing coil 26) to transmit the signals to a receiver integrated with the controller 32. The signal received from the sensing coil 26 may also be processed with other electronic components, such as an amplifier, a filter, or the like, before or after being processing by the processor 34 of the controller 32.

A second magnetic flux portion 40 emitted by the driving coil 24 may enter the sensing coil 26 without permeating the target material 14, as illustrated in FIG. 1. The second magnetic flux portion 40 may also be referred to as the leakage magnetic flux 40. As noted above, the leakage magnetic flux 40 provides little information on the magnetic characteristics (e.g., magnetic permeability) of the target material 14 because the leakage magnetic flux 40 does not permeate the target material 14. Accordingly, the leakage magnetic flux 40 may be an undesirable noise signal sensed by the sensing coil 26 relative to the signal from the first magnetic flux portion 38. The noise from the leakage magnetic flux 40 may be significant compared to the measured first magnetic flux portion 38. As discussed below, the magnetic shield 12 may help to reduce or eliminate noise associated with the leakage magnetic flux 40 by substantially or entirely blocking the leakage magnetic flux 40. Accordingly, the magnetic shield 12 may improve accuracy of sensor measurements, and thus enable better control of the machine or equipment, such as a turbomachine (e.g., a turbine engine, a compressor, a pump, or a combination thereof), a generator, a combustion engine, or a combination thereof.

In operation, the controller 32 may send a control signal to the power source 28 to deliver a desired AC current to the driving coil 24. The driving coil 24 emits the first magnetic flux portion 38 that permeates the target material 14 and is detected by the sensing coil 26. A change in the first magnetic flux portion 38 emitted from the driving coil 24 to the first magnetic flux portion 38 sensed by the sensing coil 26 due to a force applied to the target material 14 may be measured by the magnetostrictive sensing system 10. A signal corresponding to such change may be transmitted to the controller 32. The processor 34 of the controller 32 may process the signal received from the sensing coil 26 to obtain a measurement of the force applied to the target material 14. In addition, the driving coil 24 may also emit the second (i.e., leakage) magnetic flux portion 40 that does not permeate the target material 14. The corresponding signal from the leakage magnetic flux 40 sensed by the sensing coil 26 may constitute noise relative to the measured signal from the first magnetic flux portion 38.

In order to reduce or eliminate the sensed leakage flux 40 present in the magnetostrictive sensing system 10, the magnetic shield 12 in accordance with the present disclosure may be disposed between the driving pole (e.g., driving coil 24) and the sensing pole (e.g., sensing coil 26). As illustrated, the magnetic shield 12 is disposed in the space 42 between the driving pole 20 and the sensing pole 22. As discussed in greater detail below, the magnetic shield 12 may be a split tube or annulus formed from a material with a high magnetic permeability that passively shields the sensing coil 26 by reducing or eliminating the leakage flux 40 through the magnetic shield 12. Additionally, or in the alternative, the magnetic shield 12 may be a rigid or flexible substrate (e.g., printed circuit board, composite, metamaterial, mesh) formed (e.g., rolled up, molded) to a tube or an annulus that passively shields the sensing coil 26 by reducing or eliminating the leakage flux 40 through the magnetic shield 12. Additionally, or in the alternative, the magnetic shield 12 may be a rigid or flexible printed circuit board formed (e.g., rolled up, molded) to a tube or annulus that is provided with an additional driving current to emit a counter-active magnetic flux to the leakage magnetic flux 40, thereby providing active magnetic shielding to the sensing coil 26 by reducing or eliminating the leakage flux 40 through the magnetic shield 12. Moreover, the magnetic shield 12 may be a conductive coil without a substrate, wherein the conductive coil is provided with the driving current to emit the counter-active magnetic flux to the leakage magnetic flux 40, thereby providing active magnetic shielding to the sensing coil 26 by reducing or eliminating the leakage flux 40 through the magnetic shield 12. As illustrated, the leakage magnetic flux 40 sensed by the sensing coil 26 may be reduced or eliminated by the magnetic shield 12 (e.g., an active and/or passive magnetic shield). Accordingly, the leakage magnetic flux 40 is illustrated with a dashed line.

The driving coil 24 has a length 4 along an axis 46 substantially perpendicular to the portion in the core 18 connecting the driving pole 20 and the sensing pole 22, and the sensing coil 26 has a length 48 along the axis 46. The magnetic shield 12 has a length 50 along an axis 47 parallel to the axis 46. A longer length of the magnetic shield 12 may have less sensed leakage flux than a shorter length of the magnetic shield 12, the length 50 of the magnetic shield 12 is substantially the same or greater than the length 44 of the driving coil 24 and the length 48 of the sensing coil 26. Accordingly, the magnetic shield 12 may be disposed between the driving pole 20 and the sensing pole 22 such that the magnetic shield 12 substantially covers the full length of the driving coil 24 and/or the full length of the sensing coil 26.

In some embodiments in accordance with the present disclosure, the magnetostrictive sensing system 10 may include more than one magnetic shield 12. For example, more than one magnetic shield 12, coupled with each other in any suitable manner (e.g., in series, in parallel, concentric, coaxial, telescopic, or any combination thereof), may be disposed in the space 42 between the driving pole 20 and the sensing pole 22.

Figure 2:
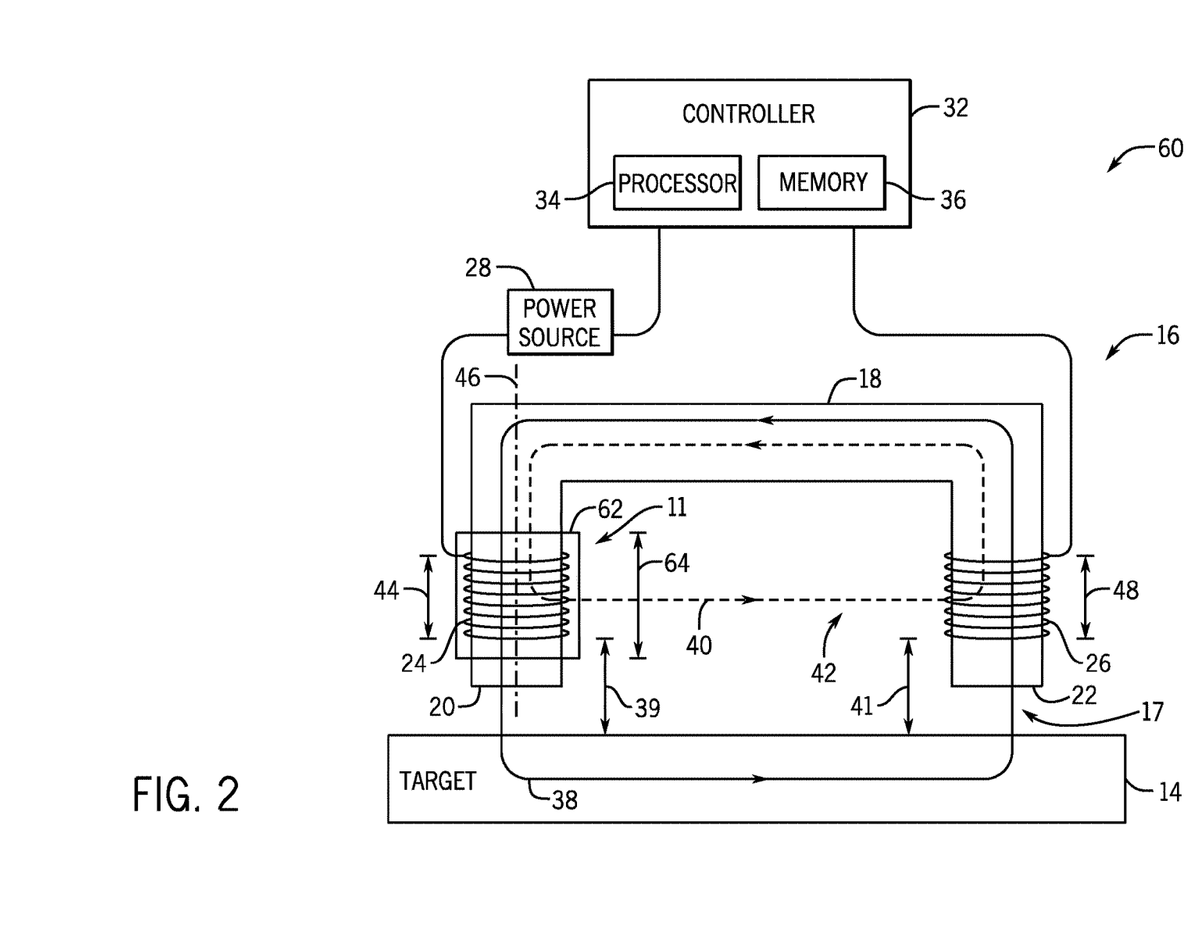
FIG. 2 is a side view of an embodiment of a magnetostrictive sensing system with a magnetic shield in accordance with the present disclosure.

FIG. 2 illustrates an embodiment of a magnetostrictive sensing system 60 that includes a magnetic shield 11 (e.g., a magnetic shield 62) disposed about (e.g., wrapped around) the driving coil 24 of the driving pole 20. Additionally, or in the alternative, the magnetic shield 62 may be disposed about (e.g., wrapped around) the sensing coil 26 of the sensing pole 22. As discussed in greater detail below, the magnetic shield 62 may be a split tube or annulus formed from a material with a high magnetic permeability. Additionally, or in the alternative, the magnetic shield 62 may be a flexible printed circuit board rolled up to a tube or annulus. As illustrated, the leakage magnetic flux 40 sensed by the sensing coil 26 may be reduced or eliminated by the magnetic shield 62. Accordingly, the leakage magnetic flux 40 is illustrated with a dashed line.

The magnetic shield 62 has a length 64 along the axis 46. Similar to the embodiment discussed above with reference to FIG. 1, a longer length of the magnetic shield 62 may have less sensed leakage flux than a shorter length of the magnetic shield 62. Accordingly, the length 64 of the magnetic shield 62 is substantially the same or greater than the length 44 of the driving coil 24 and the length 48 of the sensing coil 26. The magnetic shield 62 may be disposed about the driving pole 20 such that the magnetic shield 62 substantially covers the full length of the driving coil 24. Additionally, or in the alternative, the magnetic shield 62 may be disposed about the sensing pole 22 such that the magnetic shield 62 substantially covers the full length of the sensing coil 26.

In some embodiments in accordance with the present disclosure, more than one magnetic shield 62, coupled with each other in any suitable manner (e.g., in series, in parallel, concentric, coaxial, telescopic, or any combination thereof), may be disposed about (e.g., wrapped around) the driving coil 24 of the driving pole 20. In some embodiments, one or more magnetic shields 62 may be disposed about the driving coil 24 of the driving pole 20 together with one or more magnetic shields 12 (as illustrated in FIG. 1) disposed in the space 42 between the driving pole 20 and the sensing pole 22.

Figure 3:
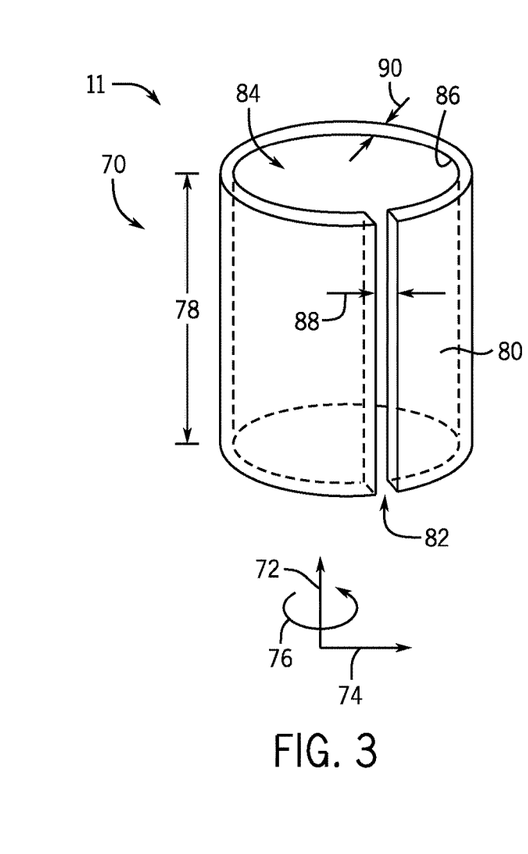
FIG. 3 is a perspective view of an embodiment of a magnetic shield in accordance with the present disclosure.

FIG. 3 illustrates an embodiment of a magnetic shield 11 (e.g., a magnetic shield 70) in accordance with the present disclosure, which may be disposed in the space 42 between the driving pole 20 and the sensing pole 22 (e.g., as shown in FIG. 1), or disposed about (e.g., wrapped around) the driving coil 24 of the driving pole 20 (e.g., as shown in FIG. 2), or a combination thereof. An axial axis 72, a radial axis 74, and a circumferential axis 76 are utilized herein to describe the magnetic shield 70. As illustrated, the magnetic shield 70 is a split cylindrical tube. The magnetic shield 70 has a length 78 along the axial axis 72. The length 78 of the magnetic shield 70 may be substantially the same or greater than the length of the driving coil 24 and the sensing coil 26 in a magnetostrictive sensing system 10 (e.g., the length 44 of the driving coil 24 and the length 48 of the sensing coil 26 in FIGS. 1 and 2).

The magnetic shield 70 includes a shell 80 (e.g., outer annular wall) that has a split 82 (e.g., an axial opening) along the axial axis 72. The split 82 of the magnetic shield 70 is for breaking the induced current path around the circumferential axis 76. The shell 80 encompasses a space 84 such that the driving pole 20 with the driving coil 24 may be fit into the space 84 without contacting the inside wall 86 of the shell 80. In some embodiments, the magnetic shield 70 includes a shell 80 without a split 82 (e.g. axial opening) wherein an insulating material (e.g., plastic, ceramic, rubber) is configured to break the induced current path around the circumferential axis 76 in a similar manner as the split 82, yet the shell 80 forms the enclosed space 84. The split 82 or insulating material may have any suitable size 88 along the circumferential axis 76, for example, less than half (e.g., approximately 3, 5, 10, 15, 20, 25, 30, 45, 60, 90, 120, 135, 175 degrees) of the circumference of the shell 80 along the circumferential axis 76. The shell 80 may also have any suitable thickness 90, including, but not limited to, between approximately 50 μm and 1000 μm, between approximately 100 μm and 750 μm, between approximately 150 μm and 500 μm, between approximately 200 μm and 400 μm, or between approximately 250 μm and 300 μm. The magnetic shield 70 may be oriented in the space 42 such that the split 82 is not disposed directly between the driving coil 24 and the sensing coil 26.

The magnetic shield 70 may be fabricated from a material with a high magnetic permeability, such as a material with a relative permeability between approximately 100 and 100,000, such as between approximately 200 and 90,000, between approximately 300 and 70,000, between approximately 500 and 50,000, between approximately 1,000 and 30,000, between approximately 2,000 and 20,000, or between approximately 5,000 and 10,000. The high magnetic permeability material of the magnetic shield 70 may include iron, Mu-metal, cobalt-iron, permalloy, nanoperm, electrical steel, ferrite, carbon steel, nickel, or any combination thereof. In some embodiments, the magnetic shield 70 may be manufactured by any suitable methods (e.g., casting, machining, molding, manual, or any combination thereof) to roll up a sheet of high magnetic permeability material as discussed herein to the desirable shape (e.g., with a cross section of a split circle, square, rectangle, triangle, or oval).

In some embodiments, the magnetic shield 70 may be formed from a composite material including, but not limited to, a magnetic particle with a base material, a conductive particle with a base material, or a magnetic and conductive particle with a base material. The magnetic particle may include ferrite ($Fe_3O_4$) particles, ferrite ($Fe_3O_4$) nanoparticles, Mu-metal, and so forth. The conductive particle may include ferrite ($Fe_3O_4$) particles, ferrite ($Fe_3O_4$) nanoparticles, mu-metal, as copper, silver, gold, aluminum, calcium, tungsten, zinc, nickel, lithium, iron, tin, platinum, carbon steel, or any combination thereof. The base material of the composite may include, but is not limited to, graphene, rubber, or plastics (e.g., silicone, acrylic). Additionally, or in the alternative, the magnetic shield 70 may be formed with carbon fibers or carbon nanotubes within a resin (e.g., polymer resin). Moreover, in some embodiments, the magnetic shield 70 may be formed from a lamination of materials wherein a first material of the lamination is a conductive and magnetic material, and a second layer is a nonconductive and non-magnetic material. For example, the magnetic shield 70 may be formed from a laminated steel.

Furthermore, some embodiments of the magnetic shield 70 may utilize metamaterials that may resonate at a desired frequency to reduce or eliminate magnetic field propagation of the leakage magnetic flux 40 between the driving pole and 20 and the sensing pole 22. The metamaterials may include printed or etched conductive layers (e.g., copper, gold, aluminum) on an insulating material (e.g., silicon, fiberglass, plastic, glass). For example, the magnetic shield 70 with metamaterials may have a split-ring resonator array that resonates at a desired frequency to reduce or eliminate the leakage magnetic flux 40. Embodiments of the magnetic shield 70 with metamaterials may be utilized in addition to a composite material, such as a ferrite particle with a silicone base material.

In some embodiments, the magnetic shield 70 may be formed with a wire wound mesh composite. For example, a copper mesh may be filled with a structural epoxy, silicone, or resin, and formed into a cylindrical or split ring shape to form the magnetic shield. Additionally, or in the alternative, one or more layers of a planar mesh material may be layered with a base material (e.g., rubber, silicone, acrylic) to form the magnetic shield 70. The one or more layers of the planar mesh material may be arranged substantially perpendicular to the leakage magnetic flux 40 between the driving pole 20 and the sensing pole 22.

As illustrated in FIG. 3, the magnetic shield 70 is substantially a cylindrical tube. In some embodiments, the magnetic shield 70 may have any suitable shape. For example, the cross section of magnetic shield 70 on the plane defined by the axes 74 and 76 may be substantially a square, a rectangle, a triangle, or an oval. In some embodiments, the magnetic shield 70 may also include a tapered portion at one or both of the two axial ends of the magnetic shield 70.

Figure 4:
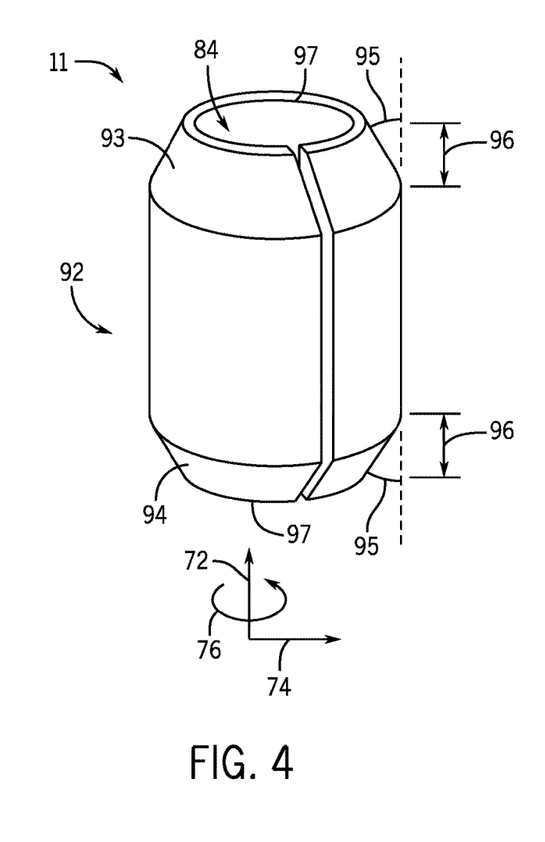
FIG. 4 is a perspective view of an embodiment of a magnetic shield in accordance with the present disclosure.

FIG. 4 illustrates an embodiment of a magnetic shield 11 (e.g., a magnetic shield 92) with tapered portions 93, 94 at both axial ends. Each of the tapered portions 93, 94 is angled inward (e.g., toward the space 84) with an angle 95 with respect to the axial axis 72. The angle 95 may be between approximately 1 degree and 90 degrees, such as between approximately 5 degrees and 80 degrees, between approximately 10 degrees and 75 degrees, between approximately 15 degrees and 70 degrees, between approximately 20 degrees and 65 degrees, between approximately 30 degrees and 60 degrees, or between approximately 40 degrees and 50 degrees.

Each of the tapered portions 93, 94 has a length 96 along the axial axis 72. The length 96 may be any suitable length such that the driving pole 20 with the driving coil 24 may be fit into the space 84 without contacting an edge 97 of each of the tapered portions 93, 94. Although the illustrated tapered portions 93, 94 have the same dimensions (e.g., the length 96 along the axial axis 72, and the angle 95 with respect to the axial axis 72), in some embodiments the tapered portions 93, 94 may have different dimensions.

Figure 5:
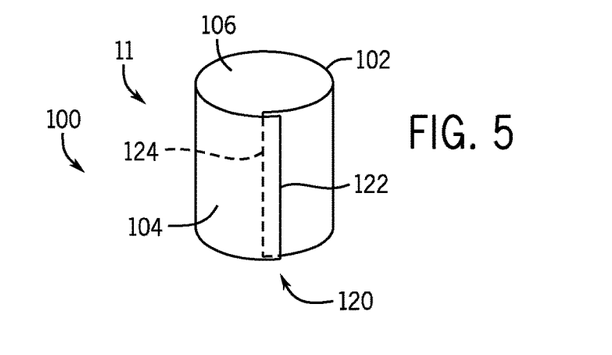
FIG. 5 is a perspective view of an embodiment of a magnetic shield in accordance with the present disclosure.
Figure 6:
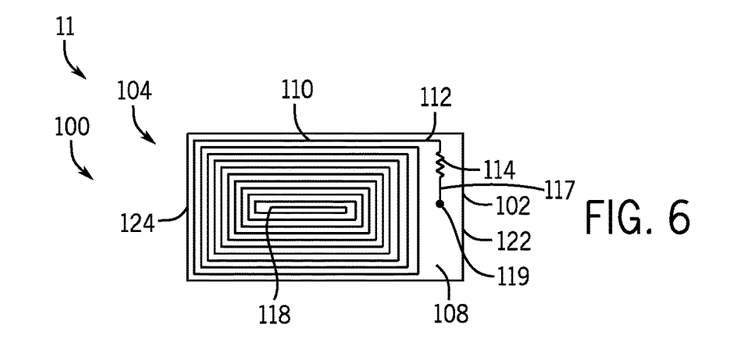
FIG. 6 is a top view of the external side of the magnetic shield in FIG. 5.
Figure 7:
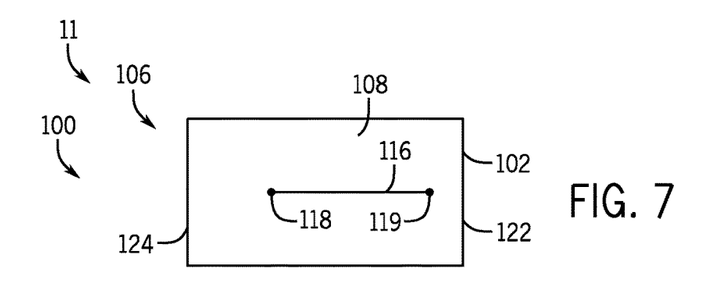
FIG. 7 is a top view of the internal side of the magnetic shield in FIG. 5.

FIGS. 5, 6, and 7 are diagrams of an embodiment of a magnetic shield 11 (e.g., a magnetic shield 100) that may be disposed in the space 42 between the driving pole 20 and the sensing pole 22 (e.g., as shown in FIG. 1), or disposed about (e.g., wrapped around) the driving coil 24 of the driving pole 20 (e.g., as shown in FIG. 2), or a combination thereof. Similar to the magnetic shield 70, the magnetic shield 100, as illustrated in FIG. 5, is substantially a cylindrical tube. In some embodiments, the magnetic shield 100 may have any suitable shape. For example, the cross section of the magnetic shield 100 may be substantially a square, a rectangle, a triangle, or an oval.

As illustrated in FIGS. 6 and 7, the magnetic shield 100 is a substantially rectangular flexible printed circuit board 102 rolled up to a substantially cylindrical tube. The magnetic shield 100 has an external side 104 and an internal side 106, which are illustrated in FIGS. 6 and 7, respectively. These two sides of the magnetic shield 100 may also be referred to herein as the front side 104 and the back side 106 of the printed circuit board 102.

FIG. 6 illustrates an embodiment of the front side 104 of the printed circuit board 102. As illustrated, the front side 104 of the printed circuit board 102 may include a substrate layer 108 and a printed pattern 110. The substrate layer 108 may be fabricated from a flexible material such as FR4 (e.g., a composite material composed of woven fiberglass cloth with an epoxy resin binder that is flame resistant), kapton, or polyamide, or any combination thereof. The substrate layer 108 may have a thickness between approximately 200 μm to 5 mm, 300 μm to 4 mm, 500 μm to 2 mm, 800 μm to 1.5 mm, or 1 mm to 1.2 mm.

The printed pattern 110 is printed or otherwise disposed (e.g., electroplated, etched) onto the substrate layer 108. The printed pattern 110 may be a spiral coil around the printed circuit board 102. In some embodiments, the printed pattern 110 may be connected lines substantially parallel to either side 104, 106 of the printed circuit board 102. The printed pattern 110 may substantially cover the front side 104 of the printed circuit board 102. In other embodiments, the printed pattern 110 may substantially cover both the front side 104 and the back side 106, for example, with the spiral coils on both sides 104, 106 around a same direction (e.g., counterclockwise or clockwise). A first end 112 of the printed pattern 110 is on the front side 104 of the printed circuit board 102, and a second end 116 of the printed pattern 110 is on the back side 106 of the printed circuit board 102 through a hole (e.g., via) 118 on the substrate layer 108 of the printed circuit board 102. The first end 112 of the printed pattern 110 may be coupled to a resistor 114. The resistor 114 is configured to properly dissipate the electrical energy generated from the leakage flux 40 such that it may have minimum back electromotive force to the driving coil 24. An end 117 of the resistor 114 is electrically connected to the second end 116 of the printed pattern 110 through a hole (e.g., via) 119 on the substrate layer 108 of the printed circuit board 102.

The printed pattern 110 may have a thickness (e.g., height arising on top of the substrate layer 108) of between approximately 10 μm to 1 mm, 20 μm to 800 μm, 30 μm to 500 μm, 40 μm to 300 μm, 50 μm to 200 μm, or 70 μm to 100 μm. The printed pattern 110 may be fabricated from a material with a high electrical conductivity, such as copper, silver, gold, aluminum, calcium, tungsten, zinc, nickel, lithium, iron, tin, platinum, carbon steel, or any combination thereof.

The magnetic shield 100 may be rolled or formed to the desirable shape (e.g., a cylindrical tube) with no split between two ends 122, 124 of the printed circuit board 102. For example, the overlapping ends 122, 124 may form an overlapping region 120 when the printed circuit board 102 is rolled up to form the cylindrical shape. The purpose of overlapping region is to ensure a complete coverage of the leakage flux in radial directions. As discussed above, the magnetic shield 100 may reduce or eliminate the leakage magnetic flux 40 between the driving coil 24 and the sensing coil 26 of the magnetostrictive sensing system 10.

In some embodiments, the magnetic shield 100 may be formed with a conductive layer (e.g., mu-metal, as copper, silver, gold, aluminum, calcium, tungsten, zinc, nickel, lithium, iron, tin, platinum, carbon steel, or any combination thereof) disposed on a rigid insulator (e.g., glass, plastic). That is, the rigid insulator may be formed, printed, or molded into the desirable shape (e.g., annular shape, split ring), then the conductive layer may be applied (e.g., printed, etched) on or within the rigid insulator.

Figure 8:
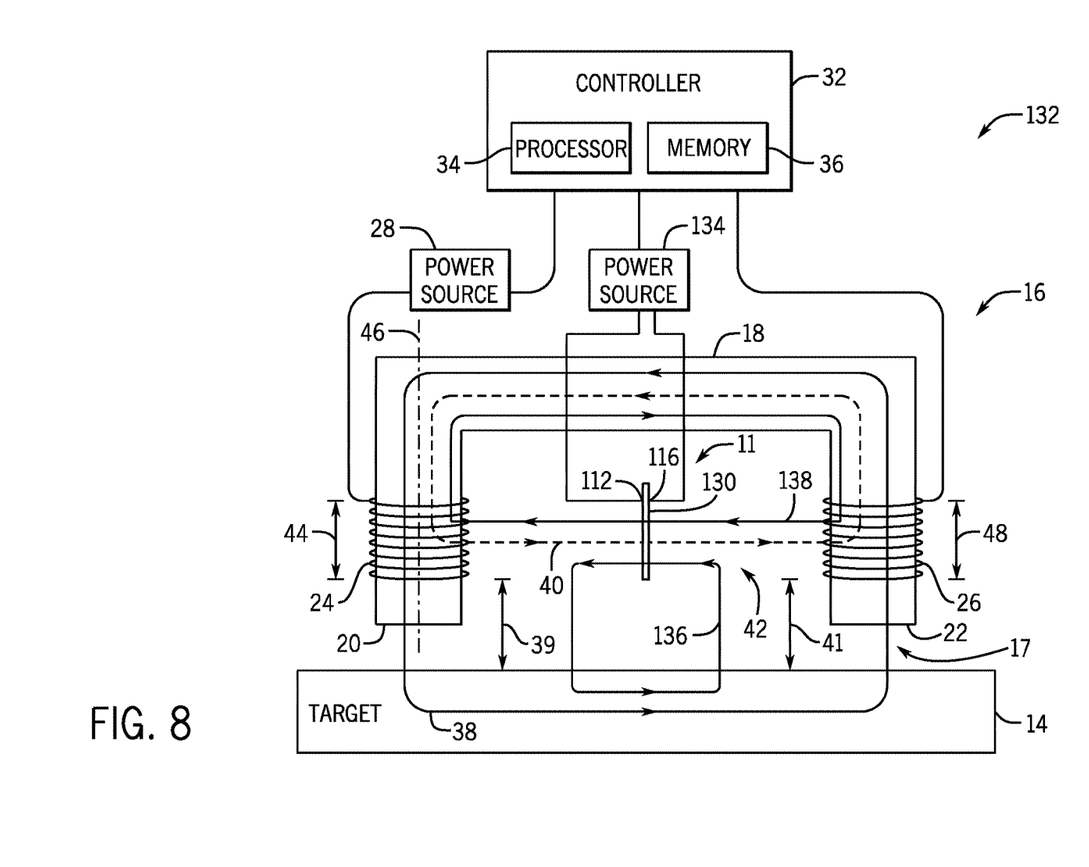
FIG. 8 is a side view of an embodiment of a magnetostrictive sensing system with a magnetic shield in accordance with the present disclosure.

FIG. 8 illustrates an embodiment of a magnetic shield 11 (e.g., an active magnetic shield 130) in accordance with the present disclosure. The magnetic shield 130 may be disposed in the space 42 between the driving pole 20 and the sensing pole 22 of a magnetostrictive sensing system 132 (e.g., as shown in FIG. 1). In some embodiments, the magnetic shield 130 may be generally the same as the magnetic shield 100 in a generally flat fashion as illustrated in FIGS. 6 and 7 (e.g., without being rolled up to a substantially cylindrical tube). In some embodiments, the magnetic shield 130 may be formed with a conductive material (e.g., wire coil, planar coil) that is not formed on a substrate. The conductive material (e.g., copper, aluminum, gold, silver) may be formed in a similar shape to the printed pattern 110 illustrated in FIG. 6 without the substrate 108. For example, the magnetic shield 130 may be an air coil. In some embodiments, the conductive material of the magnetic shield 130 may be disposed on or within an insulating material, thereby providing some support to the conductive material. For example, the conductive material of the magnetic shield may have a sheathing, coating, or adhesive that enables the conductive material (e.g., wire) to maintain a planar coil shape similar to the printed pattern 110 illustrated in FIG. 6. The front side 104 of the magnetic shield 130 may generally face either the driving pole 20 or the sensing pole 22. In some embodiments, the magnetic shield 130 may exclude the resistor 114. The magnetic shield 130 is provided with an AC current to emit additional magnetic flux, as described in greater detail below. Accordingly, the magnetic shield 130 may be referred to as an active magnetic shield. In contrast, the magnetic shield 100 is not provided with any current, thereby no additional magnetic flux is emitted by the magnetic shield 100. Accordingly, the magnetic shield 100 described above with FIGS. 5-7 may be referred to as a passive magnetic shield.

For embodiments of the active magnetic shield 130 on a substrate 108, the two ends 112, 116 of the printed pattern 110 in the magnetic shield 130 are not connected with one another via the hole 119 but are electrically coupled to a power source 134. For embodiments of the active magnetic shield 130 without a substrate 108, the two ends 112, 116 of the conductive material (e.g., wire) are electrically coupled to the power source 134. The power source 134 may be the same or separate from the power source 28. The power source 134 provides an AC current (e.g., a second driving current) to the printed pattern 110 of the active magnetic shield 130. The second driving current through the printed pattern 110 induces a third magnetic flux portion 136 and a fourth magnetic flux portion 138. As noted above, the controller 32 is electronically coupled to the power source 134. The controller 32 is configured to control characteristics (e.g., frequency, amplitude) of the second driving current delivered to the printed pattern 110 by the power source 28. In some embodiments, a combined power source (e.g., combining the power sources 28 and 134) may be used to provide power to the driving coil 24 and the magnetic shield 130.

As illustrated, the third magnetic flux portion 136 may permeate the target material 14. The third magnetic flux portion 136 may not affect the magnetic flux sensed by the sensing coil 26. The fourth magnetic flux portion 138 passes through the driving coil 24, the sensing coil 26, and the core 18 without permeating the target material 14, similar to the leakage magnetic flux 40. The AC current from the power source 134 to the active magnetic shield 130 may be synchronized with the AC current from the power source 28 to the driving coil 24 so that the fourth magnetic flux portion 138 opposes the leakage flux 40 during operation of the magnetostrictive sensing system 132. In accordance with the present disclosure, the second driving current has the same frequency as, but the opposite phase to, the first driving current. Accordingly, the fourth magnetic flux portion 138 has an opposite direction of the leakage magnetic flux 40 at a given time during operation. The magnitude of the fourth magnetic flux portion 138 may be tuned to be substantially the same as the magnitude of the leakage magnetic flux 40. Through tuning the fourth magnetic flux portion 138, the overall leakage magnetic flux (e.g., sum of the fourth magnetic flux portion 138 and the leakage magnetic flux 40) between the driving coil 24 and the sensing coil 26 may be reduced or eliminated. Because the active magnetic shield 130 is provided with a driving current (e.g., the second drive current) to actively emit a magnetic flux (e.g., the fourth magnetic flux portion 138) to negatively counteract the leakage magnetic flux 40, the printed pattern 110 of the magnetic shield 130 may also be referred to herein as a compensation coil 110.

As noted above, the magnitude of the fourth magnetic flux portion 138 may be tuned to be substantially the same as the magnitude of the leakage magnetic flux 40. The magnitude of the fourth magnetic flux portion 138 depends, at least, on magnitude of the second driving current and the number of turns of the printed pattern 110 on the substrate layer 108 or conductive coil without a substrate. Accordingly, by tuning the magnitude of the second driving current and/or the number of turns of the printed pattern 110, the magnitude of the fourth magnetic flux portion 138 may be tuned. In some embodiments, the number of turns of the printed pattern 110 of the magnetic shield 130 is the same as the number of coils of the driving coil 24. When in operation, the controller 32 may send a control signal to the power source 28 to deliver two driving currents to the driving coil 24 and the magnetic shield 130, respectively, where the two driving currents have substantially the same magnitude but the opposite phase. Accordingly, the leakage magnetic flux 40 due to the first driving current may be substantially reduced or eliminated by the fourth (or compensation) magnetic flux portion 138 with substantially the same magnitude but the opposition direction due to the second driving current.

Figure 9:
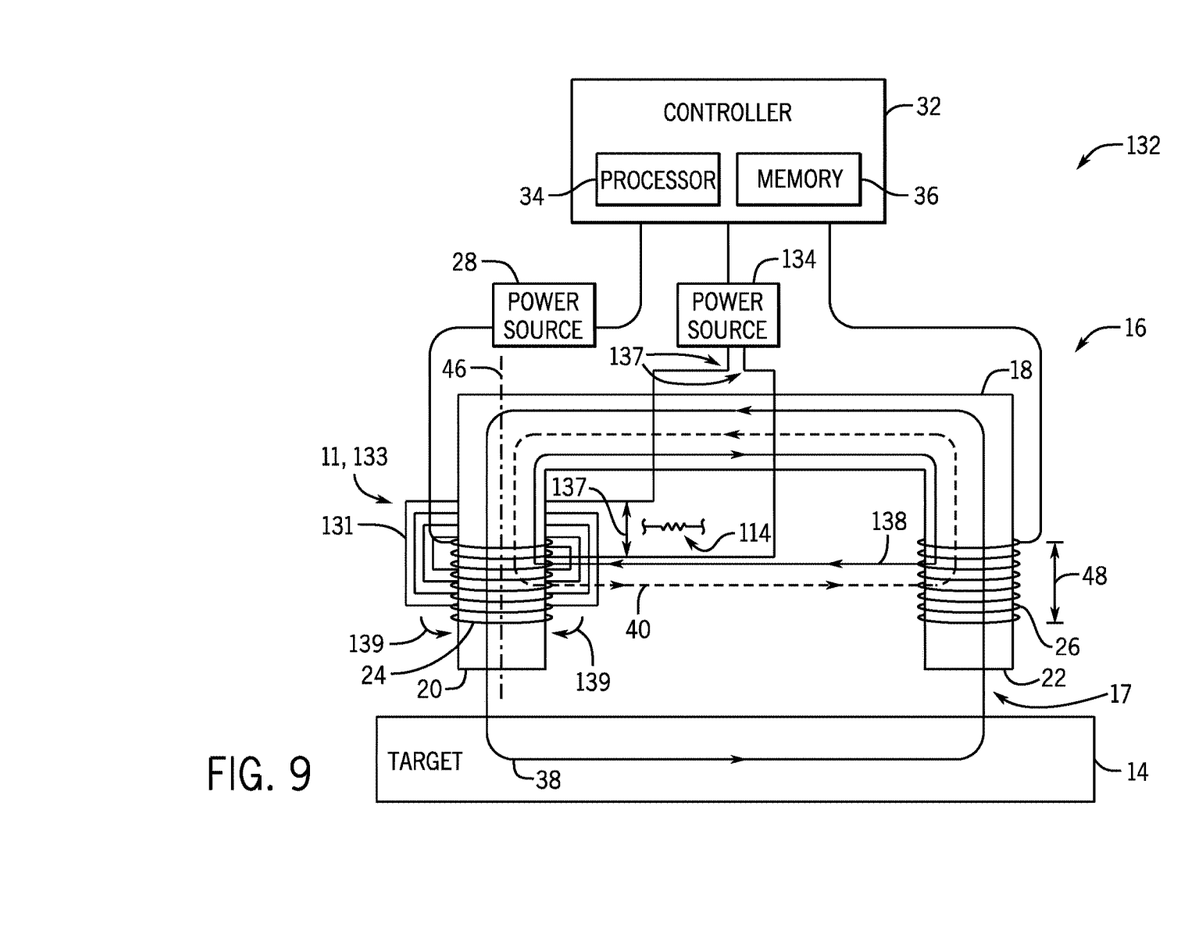
FIG. 9 is a side view of an embodiment of a magnetostrictive sensing system with a magnetic shield in accordance with the present disclosure.

In some embodiments, the magnetic shield 70 may be formed with a conductive material 131 (e.g., wire coil, planar coil) disposed about the driving coil 24 of the driving pole 20, thereby forming a conductive coil magnetic shield 133 as shown in FIG. 9. The conductive material 131 of the conductive coil magnetic shield 133 may be formed (e.g., folded, wrapped) about the axis 46 of the driving coil 24 (as shown by arrows 139) to enable the magnetic flux emitted from the conductive coil magnetic shield 133 to oppose and reduce the leakage magnetic flux 40. The conductive coil magnetic shield 133 may be a printed pattern 110 on a substrate layer 108 as discussed above with FIGS. 5-7, or the conductive coil magnetic shield 133 may be a conductive material 131 (e.g., wire) that is not formed on a substrate. That is, the conductive coil magnetic shield 133 may be an air coil without a substrate. For example, a copper or aluminum coil wound into a helical shape, spiral shape, or cylindrical planar coil shape may be disposed about the driving pole 20. In some embodiments, the conductive coil magnetic shield 133 may be disposed about the driving pole 20 in addition to one or more magnetic shields 130 discussed above with FIG. 8.

In some embodiments, the conductive coil magnetic shield 133 may be arranged with an insulating material (e.g., sheathing, plastic, rubber, glue, epoxy) to facilitate maintenance of the shape and a position of the conductive coil magnetic shield 133 about the driving pole 20. The insulating material may be disposed about (e.g., wrapped around, adhered to) an exterior of the conductive material 131. In some embodiments, the conductive material 131 is wound and disposed within the insulating material or about the insulating material. The insulating material of the conductive coil magnetic shield 133 may electrically insulate the conductive material 131 from the driving coil 24. The conductive coil magnetic shield 133 may be a flexible or rigid magnetic shield. It may be appreciated that the conductive material 131 of the conductive coil magnetic shield 133 may be formed in a variety of shapes about the driving coil 24 including, but not limited to, a circular shape, an elliptical shape, a square shape, a rectangular shape, a triangular shape, a hexagonal shape, an octagonal shape, and so forth.

If the conductive coil magnetic shield 133 is coupled to the power source 134, the power source 134 may supply a second driving current to the conductive material 131 to induce the fourth magnetic flux portion 138 from the conductive coil magnetic shield 133 (e.g., compensation coil). As discussed above with the active magnetic shield 130 of FIG. 8, the fourth magnetic flux portion 138 may be substantially opposite of the leakage flux 40, thereby reducing or eliminating the leakage flux 40 received by the sensing coil 26 of the sensing pole 22. That is, the conductive coil magnetic shield 133 may actively shield the sensing coil 26. Where the conductive coil magnetic shield 133 does not receive a driving current, the conductive coil magnetic shield 133 may passively shield the sensing coil 26. The resistor 114 may be disposed between ends 137 of the conductive material 131 in place of the power source 134.

Figure 10:
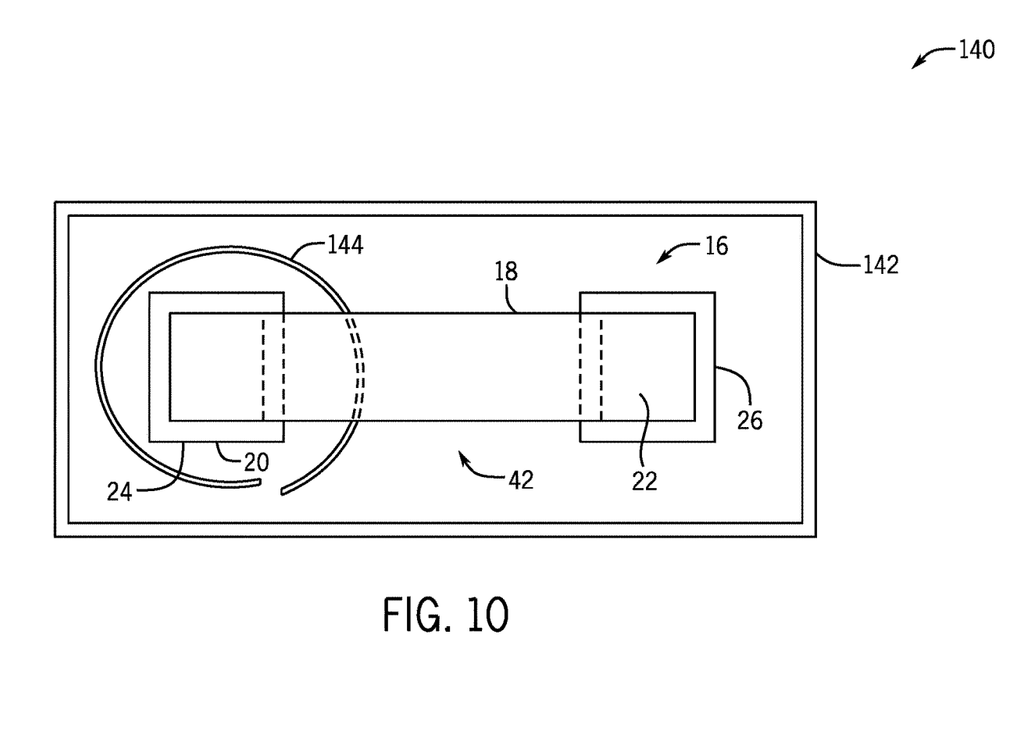
FIG. 10 is a top view of a magnetostrictive sensing system having an outer magnetic shield.

Regardless of the disposition of the magnetic shield 11 (e.g., as shown in FIGS. 1 and 2), the number of magnetic shields 11 (e.g., one or more), or the configurations and/or shapes of the magnetic shield (e.g., the magnetic shields 70, 92, 100, 130, 133), the magnetostrictive sensing systems 10, 60, 132 may additionally include an outer magnetic shield enclosing the sensor head 16. The outer magnetic shield may reduce external electromagnetic interference received by the driving coil and the sensing coil. FIG. 10 illustrates a top view of an embodiment of a magnetostrictive sensing system 140 incorporating such an outer magnetic shield 142. As discussed above, the magnetostrictive sensing system 140 includes the sensor head 16. The sensor head 16 includes the core 18, the driving pole 20, and the sensing pole 22. The driving coil 24 is disposed about the driving pole 20, and the sensing coil 26 is disposed about the sensing pole 22. As illustrated, the magnetostrictive sensing system 140 also includes a magnetic shield 11 (e.g., a magnetic shield 144) in accordance with the present disclosure (e.g., the magnetic shields 70, 92, 100, 130, 133). While the magnetic shield 144 illustrated in FIG. 10 is disposed about the driving pole 20, the magnetic shield 144, as noted above, may be in any configuration, or disposed in any space between the driving pole 20 and the sensing pole 22. For example, the magnetic shield 144 may be disposed in the space 42.

As illustrated, the magnetostrictive sensing system 140 also includes the outer magnetic shield 142. The outer magnetic shield 142 may include one or more layers for reducing the magnetic interference from an outside source. For example, in some embodiments, the outer magnetic shield 142 may include, but is not limited to, one or more layers of material with a high conductivity to reduce high frequency interference. Such high electrical conductivity material may include copper, silver, gold, aluminum, calcium, tungsten, zinc, nickel, lithium, iron, tin, platinum, carbon steel, or any combination thereof.

Alternatively or additionally, the outer magnetic shield 142 may include one or more layers of material with a high magnetic permeability to reduce low frequency interference. Such material has a relative permeability between approximately 100 to 100,000, 200 to 90,000, 300 to 70,000, 500 to 50,000, 1,000 to 30,000, 2,000 to 20,000, or 5,000 to 10,000. Such high magnetic permeability material may include, but is not limited to, iron, Mu-metal, cobalt-iron, permalloy, nanoperm, electrical steel, ferrite, carbon steel, nickel, or any combination thereof.

Figure 11:
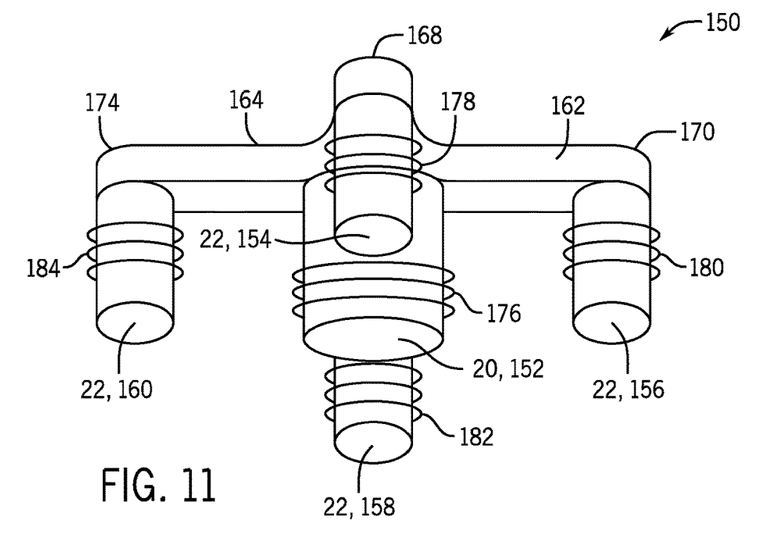
FIG. 11 is a perspective view of an embodiment of the sensor head of the magnetostrictive sensing system as illustrated in FIG. 1.
Figure 12:
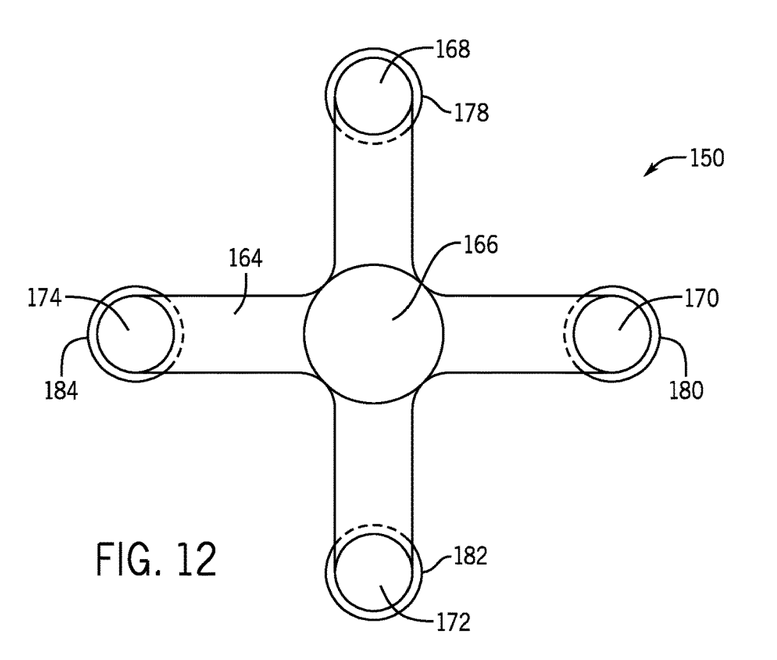
FIG. 12 is a top view of the embodiment of the sensor head in FIG. 11.

As illustrated in FIG. 1, the sensor head 16 includes a driving pole 20 and at least one sensing pole 22 with the corresponding driving coil 24 and at least one sensing coil 26 disposed thereabout, respectively. Some embodiments of the sensor head 16 may include one or more driving poles and one or more sensing poles. FIG. 11 is a perspective view of an embodiment of a sensor head 150 with one driving pole 20, 152 and four sensing poles 22, 154, 156, 158, 160. FIG. 12 is a top view of the embodiment of the sensor head 150 of FIG. 11.

As illustrated in FIGS. 10 and 11, the sensor head 150 includes a core 162. The core 162 may be fabricated from any ferromagnetic material (e.g., iron, steel, nickel, cobalt). The core 162 has a cross axis yoke 164 with a yoke portion 166. Four members 168, 170, 172, 174 of the cross axis yoke 164 extend radially outward in a plane from the yoke portion 166. The four members 168, 170, 172, 174 are substantially orthogonal to each other around the yoke portion 166. Each of the four members 168, 170, 172, 174 may extend from the yoke portion 166 in any configuration and for any length that enables each member to operate as described herein. In some embodiments, the yoke 164 may have any number of members that enables the yoke 164 to operate as described herein. For example, the sensor head 150 may have 1, 2, 3, 4, 5, 6, 7, 8, 9, 10 or more members that extend radially from the yoke portion 166. The one or more members may be angularly spaced apart by approximately 10, 20, 30, 40, 45, 60, 75, 90, 120, or 130 degrees, or any combination thereof.

As illustrated in FIG. 11, the driving pole 152 extends outward from the yoke portion 166 perpendicular to a planar surface defined by the yoke 164. In addition, the four sensing poles 154, 156, 158, 160 extend outward from the yoke 164 substantially perpendicular to the planar surface defined by the yoke 164 and substantially parallel to driving pole 152. The sensing pole 154 extends from the distal end of member 168, the sensing pole 156 extends from the distal end of member 170, the sensing pole 158 extends from the distal end of member 172, and the sensing pole 160 extends from the distal end of member 174. In some embodiments, the core 162 may have any number of poles (including driving poles and sensing poles) extending from the yoke 164 that enables the core 162 to operate as described herein. For example, the core may have one driving pole and 1, 2, 3, 4, 5, 6, 7, 8, 9, 10 or more sensing poles extending from the yoke 164. Also, a driving coil 176 is disposed about (e.g., wrapped around) the driving pole 152. Four detection coils 178, 180, 182, 184 are disposed about (e.g., wrapped around) each of the respective sensing poles 154, 156, 158, 160.

In operation, an AC current is passed through the driving coil 176 to induce the first magnetic flux portion 38. The first magnetic flux portion 38 flows from the driving pole 152, through the target material 14, to the four sensing poles 154, 156, 158, 160, where the respective sensing coils 178, 180, 182, 184 detect the first magnetic flux portion 38. As noted above, a change in the first magnetic flux portion 38 due to a force applied to the target material 14 may be measured by the sensing coils 178, 180, 182, 184. In addition, the driving coil 176 may also emit leakage magnetic fluxes 40 that do not permeate the target material 14. The signal from the leakage magnetic fluxes 40 detected by the sensing coils 178, 180, 182, 184 may constitute noise relative to the measured signal from the first magnetic flux portion 38.

In accordance with the present disclosure, one or more magnetic shields 11 (e.g., the magnetic shield 12, 62, 70, 92, 100, 130, 133, 144) may be disposed in the space between the driving pole 20, 152 and each of the respective sensing poles 22, 154, 156, 158, 160, or one magnetic shield (e.g., the magnetic shield 62, 70, 92, 100, 144) may be disposed about (e.g., wrapped around) the driving coil 24, 176 of the driving pole 20, 152, or any combination thereof. In some embodiments, more than one magnetic shield (e.g., the magnetic shield 70, 92, 100, 130, 133), coupled with each other in any suitable manner (e.g., in series, in parallel, concentric, coaxial, telescopic, or any combination thereof), may be disposed in the space 42 between the driving pole 20, 152 and each of the respective sensing poles 22, 154, 156, 158, 160, or disposed about (e.g., wrapped around) the driving coil 24, 176 of the driving pole 20, 152.

Technical effects of the subject matter disclosed herein include, but are not limited to, disposing one or more magnetic shields in the magnetostrictive sensing system to reduce or eliminate the leakage flux between the driving pole and the sensing pole. Advantageously, the resulting magnetostrictive sensing system may have an increased dynamic sensing range. In addition, the magnetic shields may improve the signal to noise ratio of the magnetostrictive sensing system.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system comprising:
a magnetostrictive sensor comprising:
a driving coil configured to receive a first driving current and to emit a first magnetic flux portion through a target and a second magnetic flux portion;
a first sensing coil configured to receive the first magnetic flux portion and the second magnetic flux portion, and to transmit a signal based at least in part on the received first magnetic flux portion;
a magnetic shield disposed between the driving coil and the first sensing coil, wherein the magnetic shield is configured to reduce the second magnetic flux portion received by the first sensing coil; and
a controller configured to supply a second driving current to a compensation coil of the magnetic shield, to receive the signal from the first sensing coil, and to control the second driving current based at least in part on a spacing between the driving coil and the first sensing coil, or a distance between the magnetostrictive sensor and the target, or any combination thereof.

2. The system of claim 1, further comprising:
a driving pole, wherein the driving coil is disposed about the driving pole; and
a first sensing pole, wherein the first sensing coil is disposed about the first sensing pole.

3. The system of claim 2, wherein the magnetic shield is disposed about the driving pole and the driving coil.

4. The system of claim 2, further comprising a second sensing pole and a second sensing coil disposed about the second sensing pole, wherein the driving pole is disposed between the first sensing coil and the second sensing coil.

5. The system of claim 1, wherein the magnetic shield comprises a composite including at least one conductive material and at least one insulating material, the at least one conductive material of the composite comprises ferrite, carbon fiber, carbon nanotubes, or any combination thereof, and the at least one insulating material of the composite comprises a rubber or a plastic.

6. The system of claim 1, wherein the magnetic shield comprises a conductive coil without a substrate.

7. The system of claim 6, wherein the conductive coil is configured to receive the second driving current and to emit a third magnetic flux portion with a magnitude substantially equal to the second magnetic flux portion and with a direction substantially opposite to the second magnetic flux portion.

8. A system, comprising:
a magnetostrictive sensor comprising:
a driving coil configured to receive a first driving current and to emit a first magnetic flux portion through a target and a second magnetic flux portion;
a first sensing coil configured to receive the first magnetic flux portion and the second magnetic flux portion, and to transmit a signal based at least in part on the received first magnetic flux portion;
an active magnetic shield disposed between the driving coil and the first sensing coil, wherein the active magnetic shield is configured to receive a second driving current, and the active magnetic shield is configured to reduce the second magnetic flux portion received by the first sensing coil; and
a controller configured to control the second driving current and to receive the signal from the first sensing coil, wherein the controller is configured to control the second driving current based at least in part on a spacing between the driving coil and the first sensing coil, or a distance between the magnetostrictive sensor and the target, or any combination thereof.

9. The system of claim 8, further comprising:
a driving pole, wherein the driving coil is disposed about the driving pole; and
a first sensing pole, wherein the first sensing coil is disposed about the first sensing pole.

10. The system of claim 9, wherein the active magnetic shield is disposed about the driving pole and the driving coil.

11. The system of claim 8, wherein the active magnetic shield comprises a conductive coil without a substrate.

12. The system of claim 8, wherein the active magnetic shield comprises a rigid insulator and a conductive layer.

13. The system of claim 8, wherein the controller is configured to determine the force applied to the target of a turbine engine, a compressor, a pump, a generator, or a combustion engine, or any combination thereof.

14. A method, comprising:
supplying a first current to a driving coil of a magnetostrictive sensor;
emitting a first magnetic flux portion from the driving coil through a target;
emitting a second magnetic flux portion from the driving coil;
sensing the first magnetic flux portion with a sensing coil of the magnetostrictive sensor;
reducing the second magnetic flux portion received by the sensing coil based at least in part on a magnetic shield of the magnetostrictive sensor disposed between the driving coil and the sensing coil;
supplying a second current to a compensation coil of the magnetic shield;
generating a signal based at least in part on the first magnetic flux portion sensed with the sensing coil; and
determining a force on the target based at least in part on the signal.

15. The method of claim 14, comprising reducing noise received by the sensing coil based at least in part on a housing, wherein the housing comprises a first layer configured to magnetically shield the sensing coil from high frequency noise and a second layer configured to magnetically shield the sensing coil from low frequency noise.

16. The method of claim 14, comprising controlling the second current to the compensation coil based at least in part on a spacing between the driving coil and the sensing coil, or a distance between the magnetostrictive sensor and the target, or any combination thereof.

* * * * *